(12) United States Patent
Narendra et al.

(10) Patent No.: US 7,671,456 B2
(45) Date of Patent: *Mar. 2, 2010

(54) POWER MANAGEMENT INTEGRATED CIRCUIT

(75) Inventors: Siva G. Narendra, Portland, OR (US); James W. Tschantz, Portland, OR (US); Howard A. Wilson, Beaverton, OR (US); Donald S. Gardner, Moutain View, CA (US); Peter Hazucha, Beaverton, OR (US); Gerhard Schrom, Hillsboro, OR (US); Tanay Karnik, Portland, OR (US); Nitin Borkar, Portland, OR (US); Vivek K. De, Beaverton, OR (US); Shekhar Y. Borkar, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 157 days.

This patent is subject to a terminal disclaimer.

(21) Appl. No.: 11/825,252

(22) Filed: Jul. 3, 2007

(65) Prior Publication Data

US 2007/0260848 A1 Nov. 8, 2007

Related U.S. Application Data

(63) Continuation of application No. 10/955,383, filed on Sep. 30, 2004, now Pat. No. 7,247,930.

(51) Int. Cl.
*H01L 23/495* (2006.01)
*H01L 23/52* (2006.01)
(52) U.S. Cl. .................. 257/675; 257/776; 257/E23.08
(58) Field of Classification Search .................. 257/675, 257/776, E23.08
See application file for complete search history.

(56) References Cited

U.S. PATENT DOCUMENTS

| 5,410,467 | A | 4/1995 | Smith et al. |
| 6,335,565 | B1 | 1/2002 | Miyamoto et al. |
| 6,365,962 | B1 | 4/2002 | Liang et al. |
| 6,469,895 | B1 | 10/2002 | Smith et al. |
| 6,791,846 | B2 | 9/2004 | Smith et al. |
| 6,831,294 | B1 * | 12/2004 | Nishimura et al. ............ 257/48 |
| 7,111,186 | B2 * | 9/2006 | Han et al. .................... 713/500 |
| 7,247,930 | B2 * | 7/2007 | Narendra et al. ............ 257/675 |
| 2003/0065966 | A1 | 4/2003 | Poisner |
| 2003/0081389 | A1 | 5/2003 | Nair et al. |
| 2003/0126477 | A1 | 7/2003 | Zhang et al. |
| 2005/0127758 | A1 | 6/2005 | Atkinson et al. |
| 2005/0207133 | A1 | 9/2005 | Pavier et al. |
| 2006/0041763 | A1 | 2/2006 | Borkar et al. |
| 2006/0065962 | A1 | 3/2006 | Narendra et al. |

FOREIGN PATENT DOCUMENTS

WO   WO 03/073250   9/2003

OTHER PUBLICATIONS

Tschanz, James W. et al. "Adaptive Body Bias for Reducing Impacts of Die-to-Die and Within-Die Parameter Variations on Microprocessor Frequency and Leakage". IEEE Journal of Solid-State Circuits, vol. 37, No. 11, Nov. 2002.

(Continued)

*Primary Examiner*—W. David Coleman
(74) *Attorney, Agent, or Firm*—Erik R. Nordstrom

(57) ABSTRACT

An integrated circuit (IC) package is disclosed. The IC package includes a first die; and a second die bonded to the CPU die in a three dimensional packaging layout.

20 Claims, 4 Drawing Sheets

OTHER PUBLICATIONS

Andrew Mason et al. "A Low-Power Wireless Microinstrumentation System for Enviromental Monitoring", IEEE Transducers-Eurosensors IX, 8th Intl. Conference on Solid State Sensors & Actuators, Jun. 25-29, 1995, pp. 107-110.

* cited by examiner

POWER MANAGEMENT INTEGRATED CIRCUIT

This application is a continuation of application Ser. No. 10/955,383, filed Sep. 30, 2004 now U.S. Pat. No. 7,247,930 entitled Power Management Integrated Circuit, and claims priority therefrom.

FIELD OF THE INVENTION

The present invention relates to computer systems; more particularly, the present invention relates to delivering power to a central processing unit (CPU).

BACKGROUND

The magnitude of power generated at CPUs is becoming an increasing concern as processing speeds increase. Thus, current power management schemes take advantage of reduced CPU activity to manage the magnitude of power consumed. However, power management circuitry is typically located at a remote location, such as on the CPU motherboard. Managing CPU power from the motherboard typically does not provide for a sufficiently fast response.

BRIEF DESCRIPTION OF THE DRAWINGS

The invention is illustrated by way of example and not limitation in the figures of the accompanying drawings, in which like references indicate similar elements, and in which.

DETAILED DESCRIPTION

According to one embodiment, a power management system for a CPU is described. In the following detailed description of the present invention, numerous specific details are set forth in order to provide a thorough understanding of the present invention. However, it will be apparent to one skilled in the art that the present invention may be practiced without these specific details. In other instances, well-known structures and devices are shown in block diagram form, rather than in detail, in order to avoid obscuring the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Figure 1:
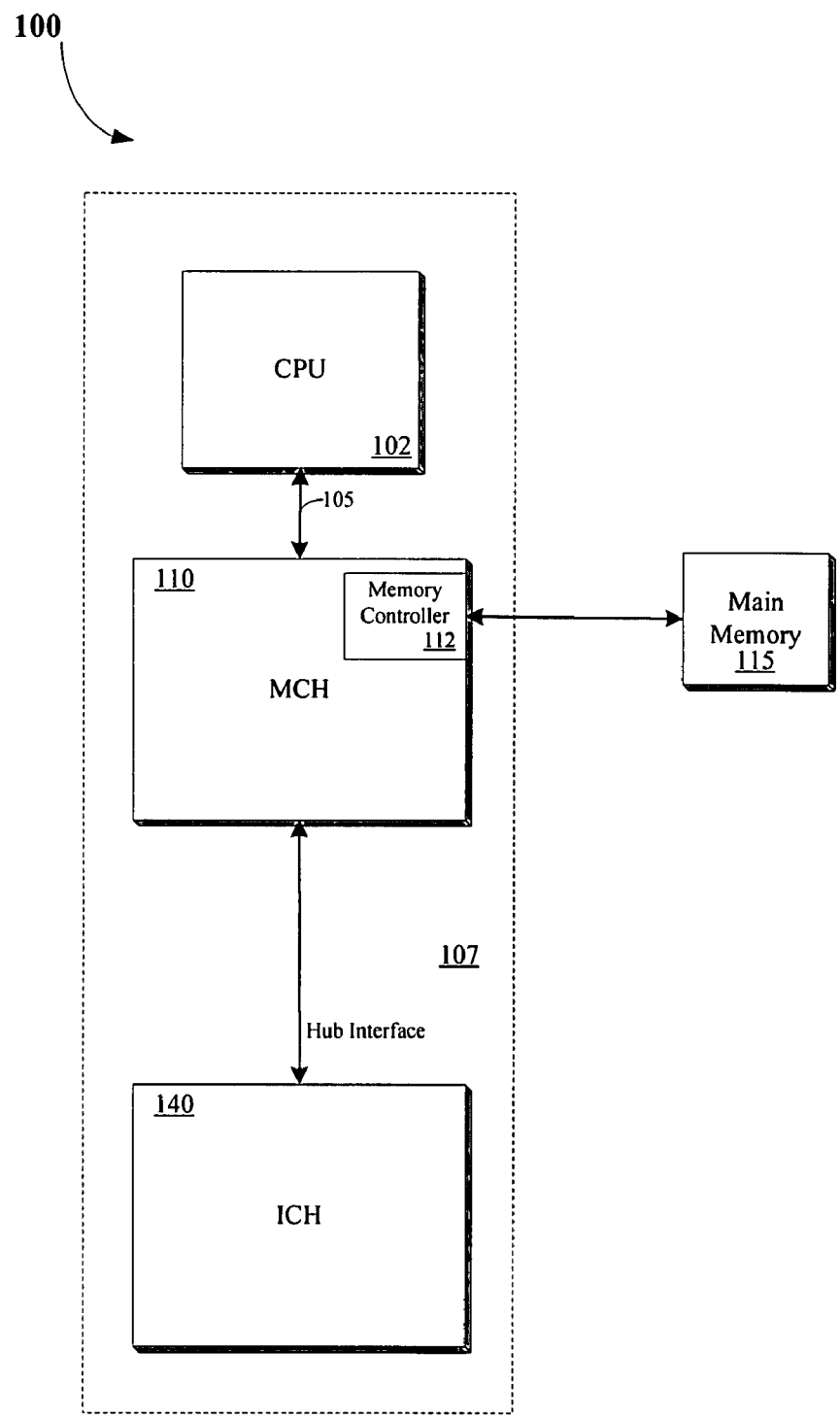
FIG. 1 is a block diagram of one embodiment of a computer system.

FIG. 1 is a block diagram of one embodiment of a computer system 100. Computer system 100 includes a central processing unit (CPU) 102 coupled to bus 105. In one embodiment, CPU 102 is a processor in the Pentium® family of processors including the Pentium® II processor family, Pentium® III processors, and Pentium® IV processors available from Intel Corporation of Santa Clara, Calif. Alternatively, other CPUs may be used.

A chipset 107 is also coupled to bus 105. Chipset 107 includes a memory control hub (MCH) 110. MCH 110 may include a memory controller 112 that is coupled to a main system memory 115. Main system memory 115 stores data and sequences of instructions that are executed by CPU 102 or any other device included in system 100. In one embodiment, main system memory 115 includes dynamic random access memory (DRAM); however, main system memory 115 may be implemented using other memory types. Additional devices may also be coupled to bus 105, such as multiple CPUs and/or multiple system memories.

Chipset 107 also includes an input/output control hub (ICH) 140 coupled to MCH 110 to via a hub interface. ICH 140 provides an interface to input/output (I/O) devices within computer system 100. For instance, ICH 140 may be coupled to a Peripheral Component Interconnect bus adhering to a Specification Revision 2.1 bus developed by the PCI Special Interest Group of Portland, Oreg.

Figure 2:
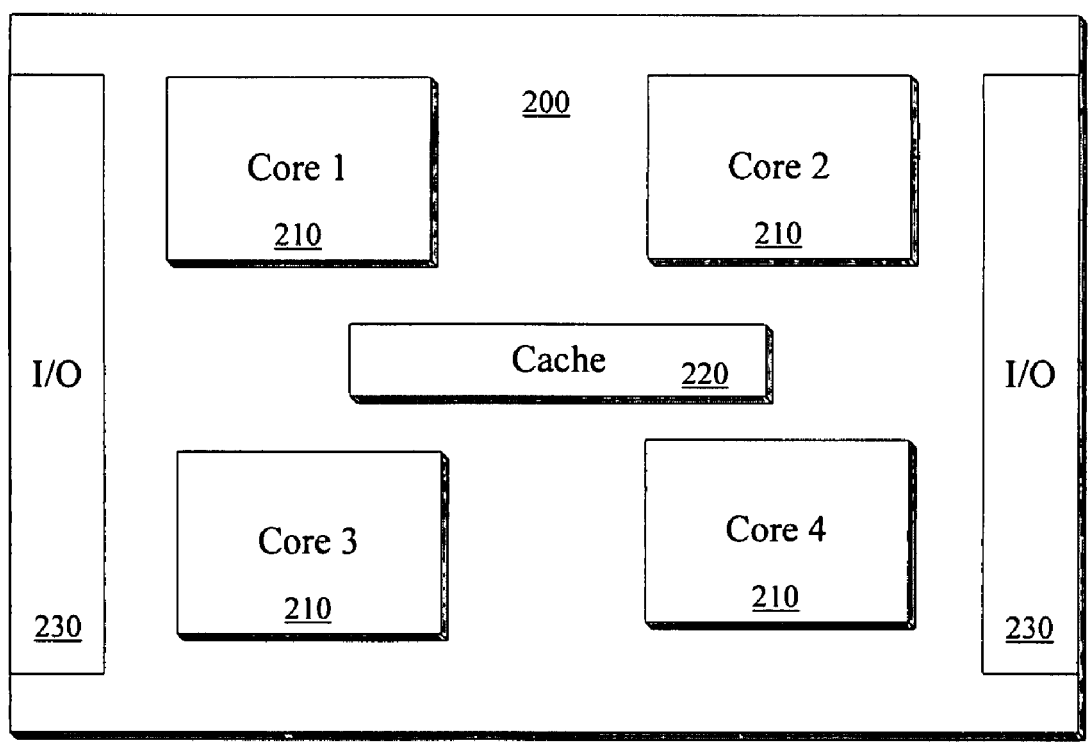
FIG. 2 illustrates one embodiment of a CPU die.

FIG. 2 illustrates one embodiment of a CPU 102 die 200. Die 200 includes four CPU processing cores (core 1-core 4) 210. In addition, die 200 includes cache 220 and I/O circuitry 230. In one embodiment, cache 220 is a L2/L3 cache. I/O circuitry 230 is placed on the periphery (e.g., north, south, east, and west boundaries) to enable efficient vertical current delivery to cores 210

As discussed above, circuitry situated on the motherboard does not provide a sufficient response for power management of a CPU die. In particular, the temperature and activity factor of CPUs change over time during operation due to varying workloads of applications. In addition, on-die Vcc values change due to noises induced by current transients.

Typically CPU frequency is set based on worst-case Vcc and temperature. As the activity factor and temperature change, energy efficiency of the CPU degrades since the optimal Vcc/Vt ratio at constant frequency is a function of activity and temperature. Off-chip VRMs and body bias generators have very large response times and thus their usefulness for dynamic control is limited.

Figure 3:
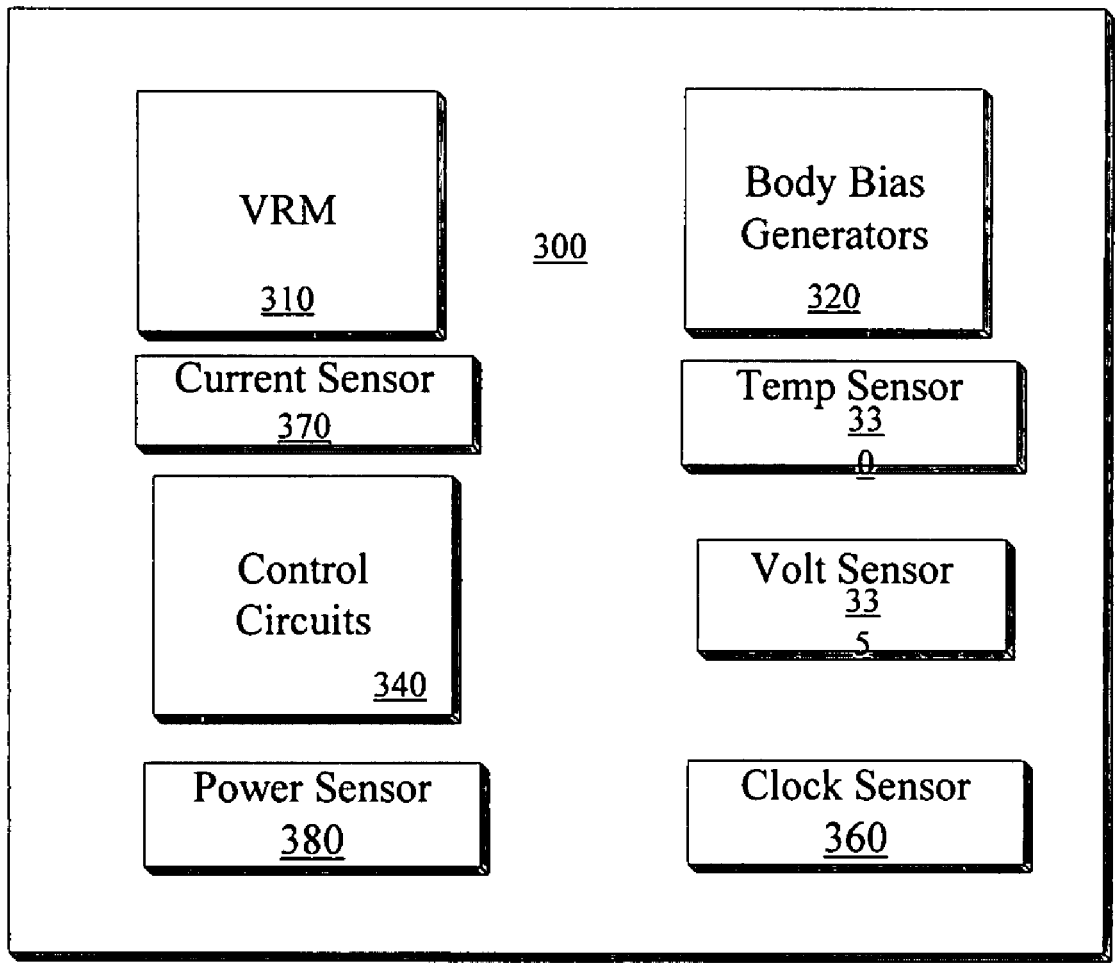
FIG. 3 illustrates one embodiment of a power management die.

According to one embodiment, a power management die is bonded to CPU die 200. FIG. 3 illustrates one embodiment of a power management die 300. Die 300 includes VRM 310, body bias generators 320, temperature sensor 330, voltage sensor 335 and control circuits 340.

In one embodiment, VRM die 310 provides a regulated voltage supply to components within CPU die 200. For instance VRM 310 supplies Vcc voltages to Core 1-Core 4, cache 220 and I/O components 230. Body bias generators 320 adjust the body bias voltages of transistors on die 200. Particularly, a non-zero body to source bias is generated to modulate the threshold voltage of the die 200 transistors to control leakage and frequency.

Temperature sensor 330 measures the temperature of die 200, while voltage sensor 335 measures the operating voltage. Control circuits 340 controls the transistors on die 200. In addition, control circuits 340 dynamically determine the optimum body voltage for the die 200 transistors. In a further embodiment, die 300 may include a clock sensor 360, a current sensor 370 and a power sensor 380.

According to one embodiment, if the workload is known ahead of time, the Vcc, Vbs and frequency of die 200 can be set to the optimal value to maximize energy efficiency for the workload. Moreover, the time to change Vcc and Vbs should be made is small since having components such as VRM 310 and body bias generators 320 bonded to die 200 provides a fast response time.

According to one embodiment, die 300 is flipped and bonded (metal-side to metal-side), thus bringing the various power management components as close to the CPU die 200 as possible. In a further embodiment, VRM die 300 is in a three dimensional (3D) packaging configuration with die 200.

Figure 4:
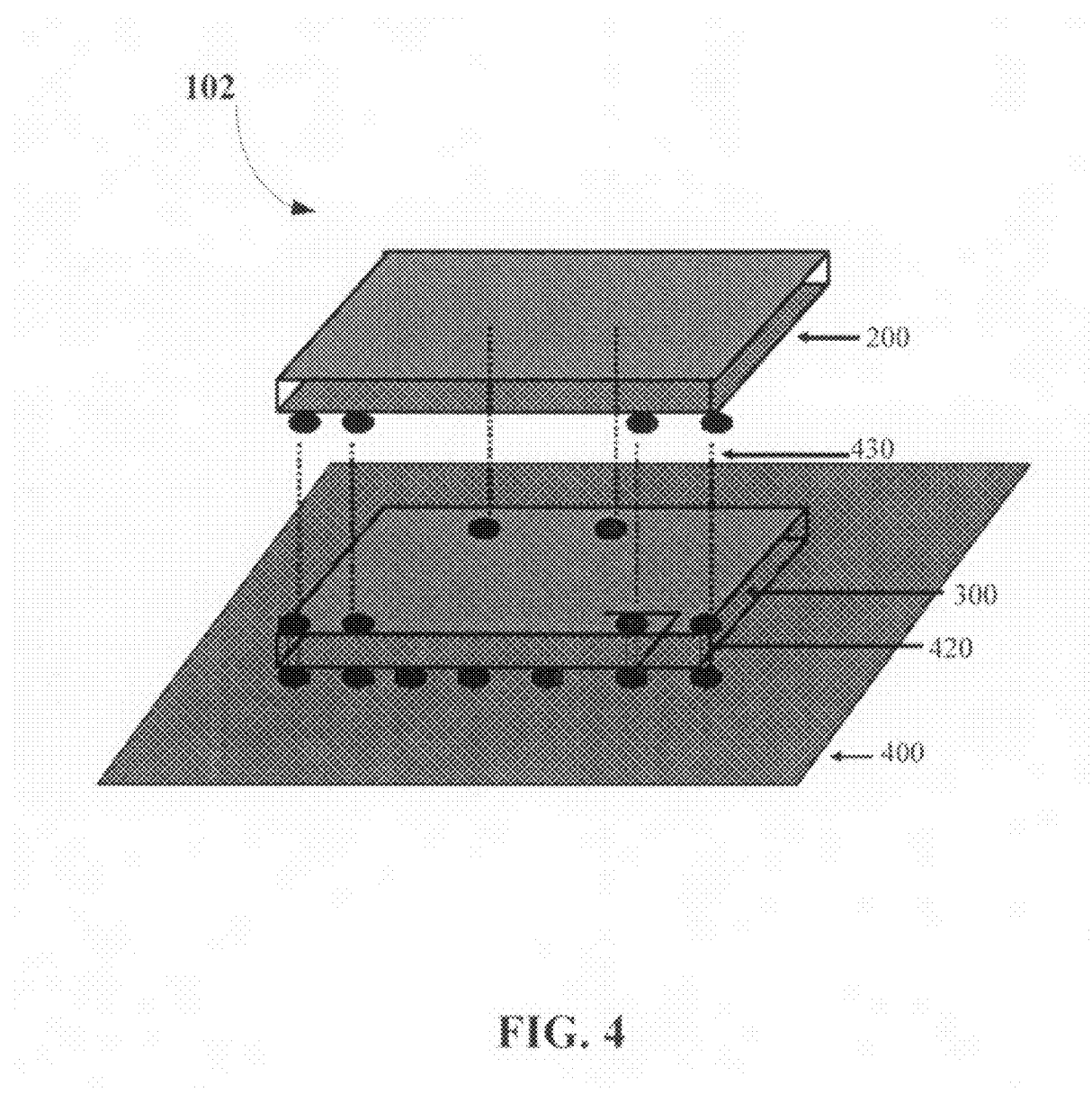
FIG. 4 illustrates one embodiment of a CPU.

FIG. 4 illustrates one embodiment of CPU 102. CPU 102 includes the multi-Vcc VRM die 300 sandwiched between CPU die 200 and a package substrate 400. According to one embodiment, VRM die 300 is pad matched to CPU die 200 and package substrate 400 so that die 300 can be an option sandwiched die. Thus, package 400 and CPU 200 design does not need any changes. In addition, FIG. 4 shows the I/O connections between die 200 and 300, as well as the die/die bonding. A heat spreader and heat sink (not shown) may be coupled to CPU die 200.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as essential to the invention.

What is claimed is:

1. An integrated circuit (IC) package comprising:
    a first die; and
    a second die to regulate the operation of the first die, the second die having a metal side surface bonded to a metal side surface of the first die in a three dimensional packaging configuration.

2. The IC package of claim 1 wherein the second die comprises a voltage regulator module (VRM) to supply a voltage to components at the first die.

3. The IC package of claim 1 wherein the second die comprises a body bias generator to adjust body voltages of transistor devices on the first die.

4. The IC package of claim 1 wherein the second die comprises a temperature sensor.

5. The IC package of claim 1 further comprising a package substrate bonded to the second die.

6. The IC package of claim 3 wherein the second die further comprises a control circuit to control the transistors on the first die.

7. The IC package of claim 6 further comprising I/O connections coupled between the second die and the first die.

8. The IC package of claim 4 wherein the second die comprises a voltage sensor.

9. The IC package of claim 5 wherein the second die is pad matched to the first die and the package substrate.

10. A method comprising:
    bonding a metal side surface of a first die to a metal side surface of a second die in a three-dimensional packaging configuration; and
    the second die regulating the operation of the first die.

11. The method of claim 10 further comprising bonding a package substrate to the second die.

12. The method of claim 10 further comprising coupling I/O connections between the first die and the second die.

13. The method of claim 11 wherein the second die is pad matched to the first die and the package substrate.

14. A system comprising:
    an integrated circuit (IC) package comprising:
        a first die; and
        a second die to regulate the operation of the first die, the second die having a metal side surface bonded to a metal side surface of the first die in a three dimensional packaging configuration; and
    a main memory device coupled to the IC package.

15. The system of claim 14 wherein the second die comprises a voltage regulator module (VRM) to supply a voltage to components at the first die.

16. The system of claim 14 wherein the second die comprises a body bias generator to adjust body voltages of transistor devices on the first die.

17. The system of claim 14 wherein the second die comprises a control circuit to control the transistors on the first die.

18. The system of claim 14 wherein the second die further comprises:
    a voltage sensor; and
    a temperature sensor.

19. The system of claim 14 further comprising I/O connections coupled between the second die and the first die.

20. The system of claim 14 wherein the IC package further comprises a package substrate bonded to the second die.

* * * * *